United States Patent [19]
Wang

[11] Patent Number: 4,992,391
[45] Date of Patent: Feb. 12, 1991

[54] PROCESS FOR FABRICATING A CONTROL GATE FOR A FLOATING GATE FET

[75] Inventor: Hsingya A. Wang, San Jose, Calif.

[73] Assignee: Advanced Micro Devices, Inc., Sunnyvale, Calif.

[21] Appl. No.: 442,903

[22] Filed: Nov. 29, 1989

[51] Int. Cl.⁵ .......................................... H01L 21/336
[52] U.S. Cl. .................................... 437/43; 437/193; 437/200
[58] Field of Search ................ 437/200, 43, 193, 192, 437/40, 41, 42, 50; 357/71, 67, 14; 148/DIG. 17, DIG. 147

[56] References Cited

U.S. PATENT DOCUMENTS

| | | | |
|---|---|---|---|
| 3,881,242 | 5/1975 | Nuttall et al. | 148/DIG. 147 |
| 4,128,670 | 12/1978 | Gaensslen | 357/71 |
| 4,373,251 | 2/1983 | Wilting | 437/200 |
| 4,389,257 | 6/1983 | Geipel, Jr. et al. | 148/DIG. 147 |
| 4,403,394 | 9/1983 | Shepard et al. | 437/193 |
| 4,640,844 | 2/1987 | Neppl et al. | 437/200 |
| 4,740,479 | 4/1988 | Neppl et al. | 437/200 |

FOREIGN PATENT DOCUMENTS 0160965 11/1985 European Pat. Off. ............ 437/200
2077993 12/1981 United Kingdom ................ 437/200

Primary Examiner—Olik Chaudhuri
Assistant Examiner—T. N. Quach
Attorney, Agent, or Firm—Fliesler, Dubb, Meyer & Lovejoy

[57] ABSTRACT

A process of forming a floating gate field-effect transistor having a multi-layer control gate line is disclosed. The multi-layer control gate line includes a first polysilicon layer, a silicide layer provided on the first polysilicon layer, and a second polysilicon layer provided on the silicide layer. The first and second polysilicon layers are formed as undoped polysilicon to improve the adhesion of the polysilicon layers to the silicide layers sandwiched therebetween. After all three layers are formed, the polysilicon layers are doped in an environment including POCl₃. Because the first and second polysilicon layers are formed as undoped layers, all three layers of the control gate line may be formed using a single pump-down.

15 Claims, 3 Drawing Sheets

PROCESS FOR FABRICATING A CONTROL GATE FOR A FLOATING GATE FET

BACKGROUND OF THE INVENTION

1. Field of the Invention

The present invention relates to processes for fabricating semiconductor devices; more particularly, processes for fabricating control gate lines for floating gate field effect transistors.

2. Description of the Related Art

The gate structure of a conventional floating gate field effect transistor (FET) includes a gate oxide layer provided on a substrate, a floating gate provided on the gate oxide layer, and a control gate separated from the floating gate by an inter-gate oxide layer. The control gate has conventionally been formed of a polysilicon layer or a polysilicon layer with a silicide layer overlying the polysilicon layer. The control gate is usually fabricated with a polysilicon layer adjacent to the inter-gate oxide in order to maintain the device characteristics provided by a polysilicon gate.

The desire to increase the speed and to reduce the power consumption of semiconductor devices has prompted the use of multi-layer structures, including a silicide layer overlying the polysilicon layer, to take advantage of the lower resistivity of the silicide. Several problems are associated with forming a silicide layer on a polysilicon layer. One such problem is that the doping level of the polysilicon must be low to insure that the silicide will adhere to the polysilicon. Poor adhesion results in silicide lift-off and device failure. Doping levels up to approximately $5 \times 10^{19}$ cm$^{-3}$ have been utilized; however, greater doping levels increase the probability of device failures beyond acceptable limits. Doping levels below $5 \times 10^{19}$ cm$^{-3}$ for the polysilicon layer create a large resistivity and power consumption and reduce speed. Further, since polysilicon is usually doped with an N-type dopant, in the fabrication of CMOS devices, the low doping level of the polysilicon layer allows P-type dopants (used to form the source and drain regions in P-channel devices) to neutralize, or invert, the doping (or conductivity type) of the polysilicon layer. An inversion of the conductivity of the polysilicon layer from N-type to P-type doping radically changes the threshold voltage ($V_t$) of the device.

A further problem associated with the formation of a multi-layer control gate is that the device must be removed from the furnace tube, or vacuum chamber, after the deposition of the polysilicon layer to allow the polysilicon layer to be doped before the silicide layer is deposited. Each time the device is removed from the furnace tube one of two problems arise. The cooling of the furnace tube to insert the wafers causes the polysilicon accumulated on the tube walls to warp or break the furnace tube due to the divergent coefficients of thermal expansion of polysilicon and quartz. Alternatively, if the tube is maintained at a high temperature and the wafers are inserted into a hot tube there is a high risk of wafer oxidation, even if a flow of an inert gas is provided, which causes yield problems.

The problem of oxidation is more severe if buried contacts are formed. Buried contacts require the removal of the inter-gate oxide and the gate oxide in the region where the buried contact is to be formed. This leaves the substrate exposed and oxidation of the substrate in the buried contact region as the wafer is inserted into a hot furnace tube will ruin a die.

SUMMARY OF THE INVENTION

It is therefore, an object of the present invention to provide an improved method of fabricating a floating gate field effect transistor.

A further object of the present invention is to provide a method of fabricating a floating gate FET having a multi-layer control gate including a highly doped polysilicon layer adjacent to the inter-gate oxide.

Another object of the present invention is to provide a method of fabricating a floating gate FET having a multi-layer control gate which improves the adhesion of a silicide layer to an underlying polysilicon layer.

Another object of the present invention is to provide a method of fabricating a multi-layer conductive line with a single vacuum chamber pump down.

A process for fabricating a floating gate field-effect transistor in accordance with the present invention comprises the steps of (a) providing a gate oxide on the substrate, (b) providing a floating gate line on the gate oxide, (c) providing an intergate oxide layer overlying the gate oxide and the floating gate line, (d) providing control gate layers, including a first undoped polysilicon layer overlying the intergate oxide layer, a silicide layer overlying the first polysilicon layer, and a second undoped polysilicon layer overlying the silicide layer, (e) annealing the control gate layers in an environment including POCl$_3$, (f) etching the control gate layers to form a control gate line, (g) etching the floating gate line using the control gate line as a mask to form a floating gate, and (h) implanting source and drain regions using the control gate line as a mask.

DESCRIPTION OF THE PREFERRED EMBODIMENT(S)

The present invention will be described with reference to FIGS. 1-7. The process of the present invention is particularly useful and is described below in the fabrication of floating gate field effect transistors. However, the process of the present invention is also applicable to the formation of any conductive line for a semiconductor device in either a bipolar or an MOS process. For example, the process of the present invention may be used to fabricate gate structures for non-floating gate field effect transistors or conductive lines for bipolar devices.

Figure 1:
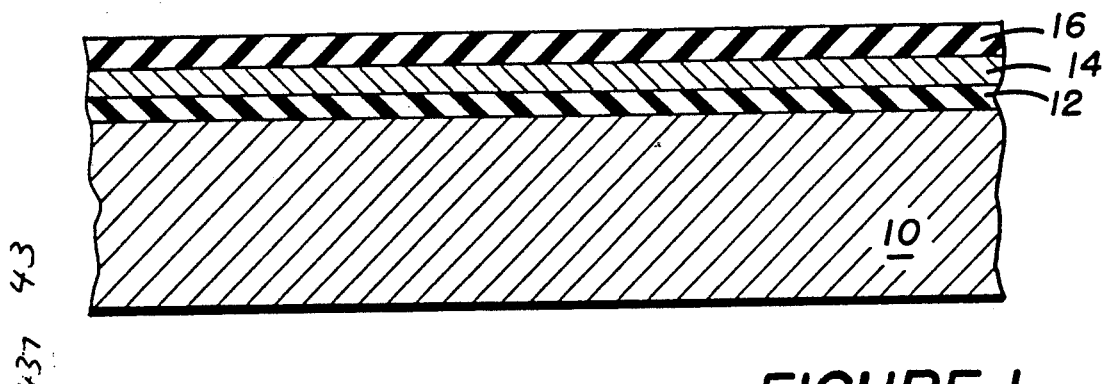
FIGS. 1-4 are cross-sectional views useful for describing the process of the present invention.

With reference to FIG. 1, the process of the present invention begins with a substrate 10 which is thermally oxidized to form a gate oxide 12. Alternatively, the gate oxide 12 may be a deposited oxide; however, thermal oxides are considered to be higher-quality oxides more suitable for use as a gate oxide. Then, field oxide regions (not shown) are provided to define the active regions where individual field effect transistors would be formed.

A floating gate material layer 14 is provided over gate oxide 12. In the preferred embodiment of the present invention floating gate material layer 14 is formed of polysilicon. The floating gate material layer 14 may have a thickness ranging from approximately 1,000 to 3,000 Å, and is approximately 1,500 Å in the preferred embodiment. The floating gate material layer 14 is then doped by annealing the device in an atmosphere comprising phosphorous oxychloride ($POCl_3$). This anneal is conducted for a time sufficient to provide floating gate material layer 14 with a doping concentration of approximately $1 \times 10^{20}$ cm$^{-3}$. In the preferred embodiment, the $POCl_3$ concentration is approximately 0.1%, and the device is annealed at a temperature of approximately 875° C. for approximately fifteen (15) minutes. Thereafter, floating gate material layer 14 is etched to form floating gate lines 14 as shown in the simplified plan view of FIG. 7.

An inter-gate oxide layer 16 is provided over gate oxide 12 and floating gate lines 14. In the preferred embodiment, intergate oxide layer 16 is a 200 Å thermal oxide grown by annealing the device at approximately 1100° C. for approximately ten minutes in an environment including dry oxygen and HCl. Alternatively, intergate oxide 16 may be a deposited oxide.

Figure 2:
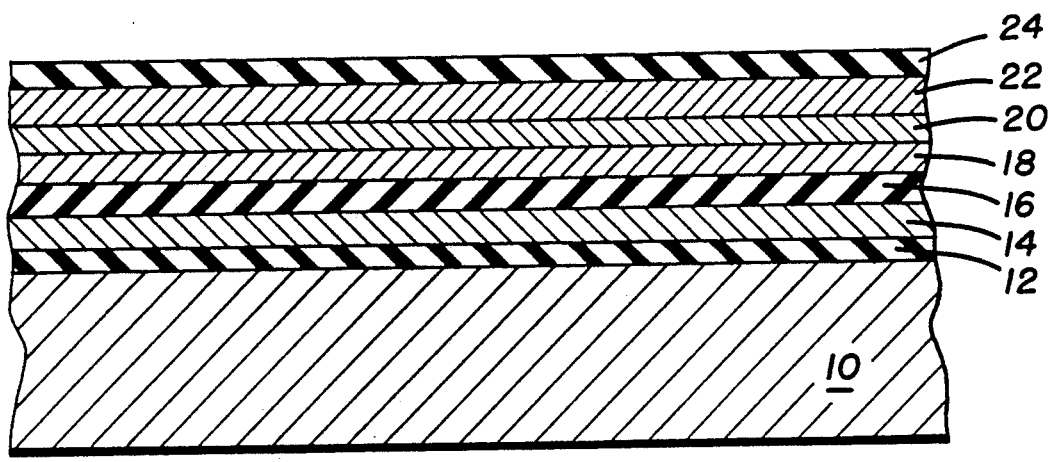

The formation of the layers which ultimately form the control gate lines will be described with reference to FIG. 2. First, an undoped polysilicon layer 18 having a thickness ranging approximately from 50 to 5,000Å, 2,000 Å in the preferred embodiment, is provided over intergate oxide 18. Polysilicon layer 18 is formed as an undoped layer using conventional deposition techniques. Then, a silicide layer 20 is provided on polysilicon layer 18. The silicide may be selected from the group including $TaSi_2$, $WSi_2$, $TiSi_2$, and $MoSi_2$; $WSi_2$, the preferred silicide, is deposited, for example, in an environment including $SiH_2Cl_2$ and $WF_6$ at a temperature of approximately 600° C. The thickness of silicide layer 20 may range from approximately 500 to 5,000 Å; in the preferred embodiment silicide layer 20 is a thickness of approximately 2,000 Å. An undoped polysilicon layer 22 is then provided over silicide layer 20. The thickness of polysilicon layer 22 may be approximately 50 to 2,500 Å, with the preferred embodiment having a thickness of approximately 1,000 Å.

Polysilicon layers 18 and 22 are formed as undoped polysilicon in order to improve the adhesion of these layers to silicide layer 20. After the three control gate layers, including polysilicon layer 18, silicide layer 20, and polysilicon layer 22, are formed, polysilicon layers 18 and 22 are doped by annealing the device in a $POCl_3$ environment. The desired impurity concentration (doping level) in polysilicon layers 18 and 22 is greater than approximately $5 \times 10^{19}$ cm$^{-3}$ and in the preferred embodiment the doping level is approximately $3-5 \times 10^{20}$ cm$^{-3}$. In the preferred embodiment, polysilicon layers 18 and 22 are doped in an environment including a nitrogen carrier, approximately 0.1% $POCl_3$, and approximately 5% oxygen. The anneal is performed at approximately 875° C. for approximately thirty (30) minutes. The doping of polysilicon layer 18 is not adversely affected by the presence of silicide layer 20.

In accordance with the present invention it is possible to form polysilicon layer 18, silicide layer 20, and polysilicon layer 22 using a single pump-down cycle because the device is not required to be removed from the vacuum chamber used to deposit these layers in order to dope the individual layers as they are formed.

After polysilicon layers 18 and 22 are doped, a capping oxide layer is formed over polysilicon layer 22. In the preferred embodiment, capping oxide layer 24 is a thermal oxide having a thickness of approximately 1,000 Å, formed by oxidation in an atmosphere including dry oxygen and HCl at a temperature of approximately 900° C. for a period of approximately fifty (50) minutes.

Figure 3:
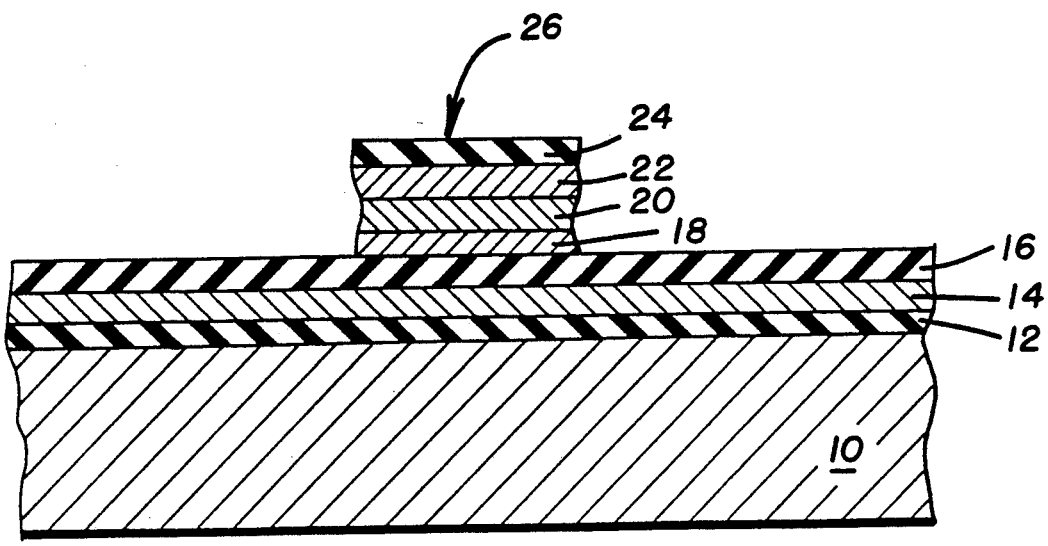
Figure 6:
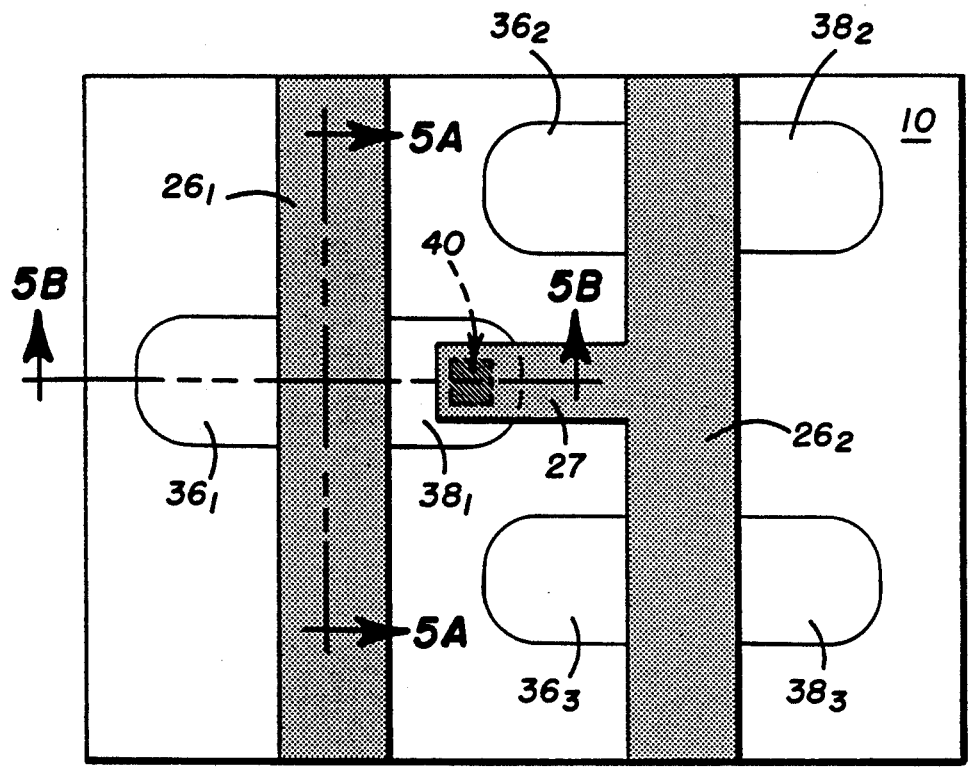
FIG. 6 is a simplified plan view of a semiconductor device fabricated in accordance with the process of the present invention.

The etching of the control gate layers, 18, 20, 22 and oxide layer 24 to form control gate lines will be described with reference to FIG. 3. A photo-resist layer (not shown) is formed on oxide layer 24, and is then patterned using a conventional lift-off process so that the photo-resist remains on the portions of the control gate layers and oxide layer 24 which will form control gate lines. Then, oxide layer 24 is etched using an etchant which is effective for silicon oxide, and subsequently polysilicon layer 18, silicide layer 20, and polysilicon layer 22 are etched using an etchant which is effective for etching polysilicon. Because etchants which are effective for etching polysilicon are generally not selective for silicon oxide, intergate oxide layer 16 serves as an etch-stop layer. This etching process forms control gate lines 26 (FIG. 6). The relationship of a floating gate line 14 and a control gate line 26 is shown in the plan view of FIG. 7. The sectional view of FIG. 3 is in the direction of arrow A in FIG. 7.

Figure 4:
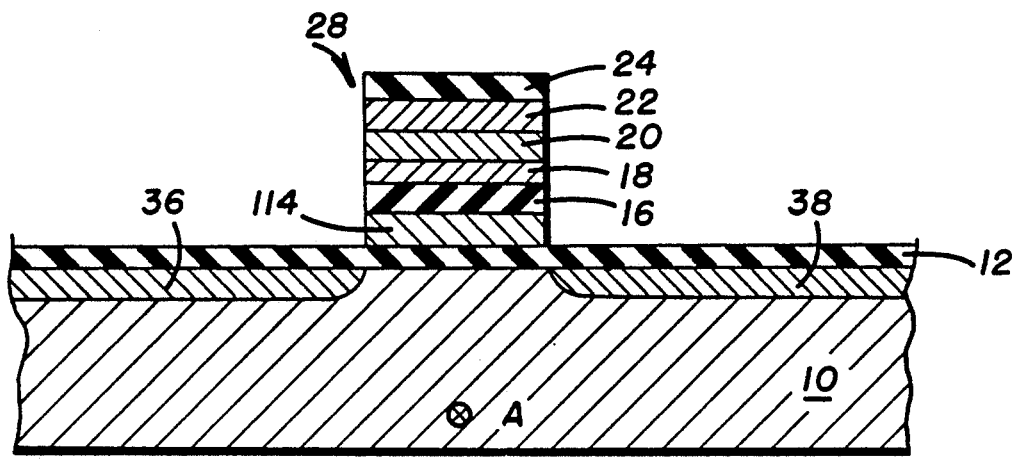
Figure 5A:
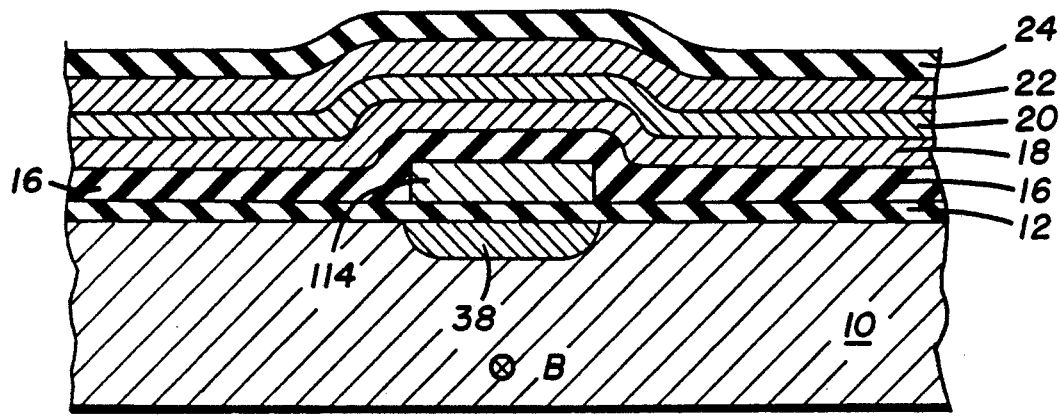
FIG. 5A is a cross-sectional view along line 5A—5A in FIG. 6 useful in describing the process of the present invention.
Figure 7:
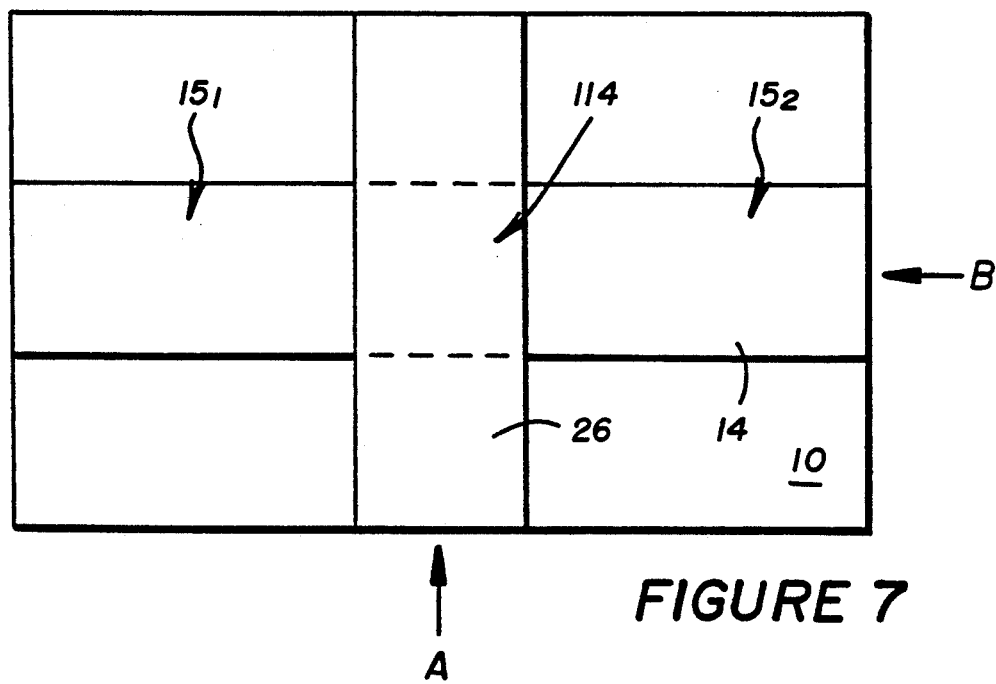
FIG. 7 is a simplified plan view useful in describing the process of the present invention.

With reference to FIG. 4, intergate oxide layer 16 is etched using the control gate line 26 as a mask, and then the portions of floating gate lines 14 which do not underlie control gate line 26 are removed by etching; the portions of the floating gate line which are removed by etching are designated $15_1$ and $15_2$ in FIG. 7. The etching of floating gate line 14 to form a floating gate 114 completes the fabrication of gate structure 28. FIG. 5A, which corresponds to a view in the direction of arrow B in FIG. 7, shows floating gate 114 under inter-gate oxide 16 and control gate line 26 (including layers 18, 20, and 22). Gate structure 28 is then used as a mask to implant self-aligned source and drain regions 36, 38. Then, the source/drain implant is driven and a thick thermal oxide (not shown) is grown on the sides of gate structure 28 to electrically insulate the floating gates 114. The fabrication of the field-effect transistor is completed by providing metallization and passivation layers in accordance with conventional techniques.

Figure 5B:
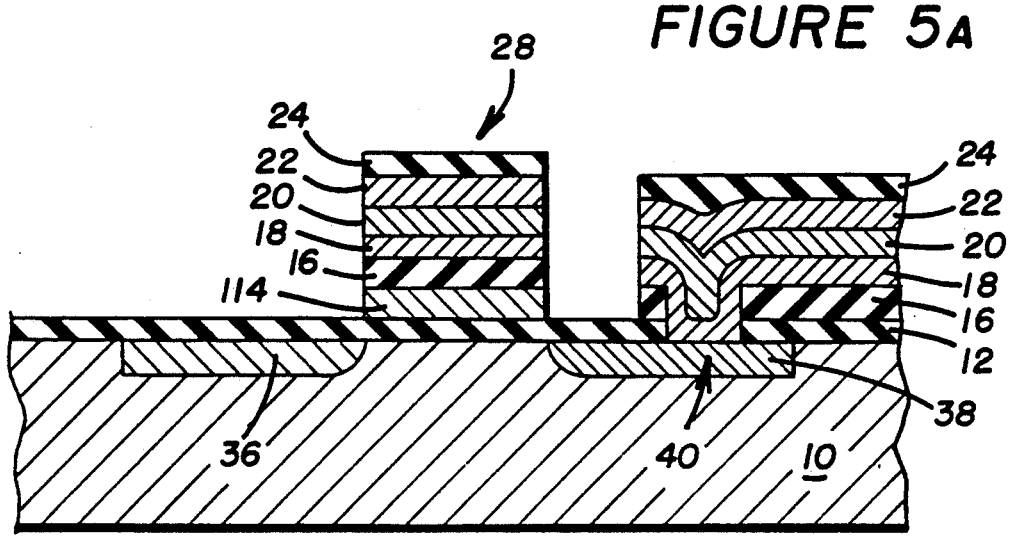
FIG. 5B is a cross-sectional view along line 5B—5B in FIG. 6 useful in describing an alternative embodiment of the process of the present invention.

The utilization of the present invention to form floating gate field effect transistors having buried contacts will be described with reference to FIGS. 5B and 6. As shown in FIG. 6, one example of a buried contact is an extension 27 of control gate line $26_2$ which contacts the drain region $38_1$ of a field effect transistor formed on adjacent control gate line $26_1$. A simplified cross-sectional view of a floating gate field effect transistor having a buried contact is shown in the cross-sectional view of FIG. 5B, taken along line 5B—5B in FIG. 6. In order to form buried contact 40, a portion of intergate oxide 16 and gate oxide 12 are removed by etching prior to the formation of the control gate material layers. This etching is performed by providing a photo-resist layer, which is patterned using conventional lift-off techniques so that only the buried contact regions are exposed. Polysilicon layer 18, silicide layer 20, and polysilicon layer 22 are then formed in accordance with the process described above. The use of a load lock chamber is particularly useful for providing the control gate layers when buried contacts are formed so that oxidation of the substrate in the region of buried contact 40 is prevented.

The disclosed embodiments of the present invention are intended to be illustrative and not restrictive, and the scope of the invention is defined by the following claims rather than by the foregoing description.

I claim:

1. A process for fabricating a control gate line for a floating gate field effect transistor formed in a semiconductor substrate, comprising the steps of:
   (a) providing a floating gate overlying the substrate;
   (b) providing an inter-gate oxide overlying the floating gate;
   (c) providing a first undoped polysilicon layer overlying the inter-gate oxide;
   (d) providing a silicide layer overlying the first polysilicon layer;
   (e) providing a second undoped polysilicon layer overlying the silicide layer;
   (f) doping the first and second polysilicon layers after said steps (d) and (e); and
   (g) etching the first polysilicon layer, the silicide layer and the second polysilicon layer to form a conductive line after said step (f).

2. A process according to claim 1, wherein said step (f) comprises annealing the first and second polysilicon layers in an environment including POCl$_3$.

3. A process according to claim 1, wherein said step (f) comprises concurrently doping the first and second polysilicon layers.

4. A process according to claim 1, wherein said step (f) comprises providing the first and second polysilicon layers with a doping concentration of at least approximately $5 \times 10^{19}$ cm$^{-3}$.

5. A process according to claim 1, wherein said step (f) comprises providing the first and second polysilicon layers with a doping concentration of greater than approximately $1 \times 10^{20}$ cm$^{-3}$.

6. A process according to claim 1, wherein said step (f) comprises providing the first and second polysilicon layers with a doping concentration of approximately $3-5 \times 10^{20}$ cm$^{-3}$.

7. A process for fabricating a field-effect transistor, comprising the sequential steps of:
   (a) providing a gate oxide on the substrate;
   (b) providing a floating gate line on the gate oxide;
   (c) providing an intergate oxide layer overlying the gate oxide and the floating gate line;
   (d) providing control gate layers, including a first undoped polysilicon layer overlying the intergate oxide layer, a silicide layer overlying the first polysilicon layer, and a second undoped polysilicon layer overlying the silicide layer;
   (e) annealing the control gate layers in an environment including ROCl$_3$;
   (f) providing a capping oxide layer overlying the control gate layers;
   (g) etching the control gate layers to form a control gate line;
   (h) etching the floating gate line using the capping oxide layer and the control gate line as a mask to form a floating gate; and
   (i) implanting source and drain regions using the control gate line as a mask.

8. A process according to claim 7, wherein said step (e) comprises providing the first and second polysilicon layers with a doping concentration of at least $5 \times 10^{20}$ cm$^{-3}$.

9. A process according to claim 7, wherein said step (e) comprises providing the first and second polysilicon layers with a doping concentration of greater than approximately $1 \times 10^{20}$ cm$^{-3}$.

10. A process according to claim 7, wherein said step (e) comprises providing the first and second polysilicon layers with a doping concentration of approximately $3-5 \times 10^{230}$ cm$^{-3}$.

11. A process for fabricating an integrated circuit having a plurality of transistors including at least one floating gate field-effect transistor formed in a substrate, comprising of the steps of:
   (a) providing a gate oxide on the substrate;
   (b) providing floating gate lines on the gate oxide;
   (c) providing an intergate oxide layer overlying the gate oxide and the floating gate lines;
   (d) removing selected portions of the gate oxide and the intergate oxide corresponding to the positions of buried contacts;
   (e) providing control gate layers, including a first undoped polysilicon layer overlying the intergate oxide layer and and contacting the substrate in the regions where the gate oxide and intergate oxide are remove,, a silicide layer overlying the first polysilicon layer, and a second undoped polysilicon layer overlying the silicide layer;
   (f) annealing the control gate layers in an environment including POCl$_3$;
   (g) thermally oxidizing the second polysilicon layer to form a capping oxide;
   (h) etching the capping oxide and the control gate layers to form control gate lines and buried contacts;
   (i) etching the floating gate lines using the capping oxide and the control gate line as a mask to form floating gates underlying the control gate lines; and
   (j) implanting source and drain regions using the capping oxide and the control gate lines as masks.

12. A process for fabricating a floating gate field-effect transistor (FET) on a substrate, comprising the sequential steps of:
   (a) providing a gate oxide overlying the substrate;
   (b) providing a first polysilicon layer overlying the gate oxide layer;
   (c) annealing the first polysilicon layer in an environment including POCl$_3$;
   (d) etching the first polysilicon layer to form floating gate lines;
   (e) providing an inter-gate oxide layer overlying the floating gate lines and the gate oxide;
   (f) placing the substrate in a vacuum chamber and reducing the pressure in the vacuum chamber;
   (g) providing control gate material layers overlying the intergate oxide layer, the control gate material layers including a second undoped polysilicon layer, a silicide layer overlying the second polysilicon layer and a third undoped polysilicon layer overlying the silicide layer, without breaking the vacuum formed in said step (f);
   (h) annealing the substrate in an environment including POCl$_3$ to provide the second and third polysilicon layers with a doping concentration greater than approximately $1 \times 10^{20}$ cm$^{-3}$;
   (i) thermally oxidizing the third polysilicon layer to form a capping oxide layer;

(j) etching the capping oxide layer, the control gate material layers, and the inter-gate oxide layer to form control gate lines;

(k) etching the floating gate lines using the capping oxide and the control gate lines as masks to form floating gates; and (l) implanting source and drain regions using the control gate lines as masks.

13. An improved process for fabricating a floating gate transistor in a substrate including the steps of (a) providing a gate oxide layer overlying the substrate, (b) providing a floating gate material layer overlying the gate oxide, (c) providing an inter-gate oxide layer overlying the floating gate material layer, (d) providing control gate material layers overlying the inter-gate oxide layer (e) etching the control gate material layer to form a control gate and (f) etching the floating gate material layer to form a floating gate, characterized in that:

said step (d) comprises:

(1) providing a first undoped polysilicon layer overlying the inter-gate oxide layer, (2) providing a silicide layer overlying the first polysilicon layer, and (3) providing a second undoped polysilicon layer overlying the silicide layer; and the first and second polysilicon layers are doped after said step (d) and before said step (e).

14. A process according to claim 13, further characterized in that the first undoped polysilicon layer, the silicide layer and the second polysilicon layer provided in said step (d) are provided in a sealed vacuum chamber without breaking the seal.

15. A process according to claim 13, further characterized that said step (d) further comprises (4) providing the first and second polysilicon layer with a doping concentration greater than approximately $1 \times 10^{20}$ cm$^{-3}$.

* * * * *